United States Patent
Min et al.

(10) Patent No.: US 8,007,617 B2
(45) Date of Patent: Aug. 30, 2011

(54) METHOD OF TRANSFERRING CARBON NANOTUBES

(75) Inventors: Yo-seb Min, Seoul (KR); Un-jeong Kim, Busan (KR); Eun-ju Bae, Seoul (KR); Eun-hong Lee, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 365 days.

(21) Appl. No.: 12/213,047

(22) Filed: Jun. 13, 2008

(65) Prior Publication Data

US 2009/0183816 A1    Jul. 23, 2009

(30) Foreign Application Priority Data

Jan. 17, 2008  (KR) .................. 10-2008-0005380

(51) Int. Cl.
| | |
|---|---|
| B44C 1/16 | (2006.01) |
| B32B 7/04 | (2006.01) |
| C09J 5/02 | (2006.01) |
| B29C 65/72 | (2006.01) |
| B32B 7/14 | (2006.01) |
| C09J 5/04 | (2006.01) |
| B29C 65/02 | (2006.01) |

(52) U.S. Cl. ........ 156/235; 156/230; 156/310; 156/314; 156/497

(58) Field of Classification Search .................. 156/230, 156/235, 310, 314, 497
See application file for complete search history.

(56) References Cited

U.S. PATENT DOCUMENTS

| | | | | |
|---|---|---|---|---|
| 6,097,138 | A * | 8/2000 | Nakamoto | 313/309 |
| 6,232,706 | B1 * | 5/2001 | Dai et al. | 313/309 |
| 6,808,746 | B1 * | 10/2004 | Dai et al. | 427/249.1 |
| 6,811,957 | B1 * | 11/2004 | Mau et al. | 430/315 |
| 6,866,801 | B1 * | 3/2005 | Mau et al. | 264/29.1 |
| 7,538,040 | B2 * | 5/2009 | Gu et al. | 438/717 |
| 2004/0142172 | A1 * | 7/2004 | Sugiyama et al. | 428/403 |
| 2004/0241896 | A1 * | 12/2004 | Zhou et al. | 438/48 |

OTHER PUBLICATIONS

Li W Z et al: "Large-Scale Synthesis of Aligned Carbon Nanotubes" Science, American Association for the Advancement of Science, US, vol. 274, Oct. 17, 1996, p. 1701-1703, XP000877484.*
Che G et al: "Chemical Vapor Deposition Based Synthesis of Carbon Nanotubes and Nanofibers Using a Template Method" Chemistry of Materials, American Chemical Society, Washington, US. vol. 10, No. 1, 1998, pp. 260-267, XP000776644.*
Huang S et al: "Patterned Growth and Contact Transfer of Well-Aligned Carbon Nanotube Films" Journal of Physical Chemistry. B, Materials, Surfaces, Interfaces and Biophysical, Washington, DC, US, vol. 103, No. 21, May 27, 1999, pp. 4223-4227, XP000957804.*
Search Report EP00926581—Apr. 22, 2004.*
Dai Liming et al: "Multilayer Carbon Nanotube Films" WO 00/63115 A, Oct. 26, 2000.*

* cited by examiner

*Primary Examiner* — Sonya Mazumdar
(74) *Attorney, Agent, or Firm* — Harness, Dickey & Pierce, P.L.C.

(57) ABSTRACT

Provided is a method of transferring carbon nanotubes formed on a donor substrate to an acceptor substrate which may include vertically forming carbon nanotubes on a first substrate, providing a second substrate, aligning the first substrate with the second substrate so that the carbon nanotubes face the second substrate, and transferring the carbon nanotubes onto the second substrate by pressing the first substrate onto the second substrate.

16 Claims, 7 Drawing Sheets

METHOD OF TRANSFERRING CARBON NANOTUBES

PRIORITY STATEMENT

This application claims priority under 35 U.S.C. §119 to Korean Patent Application No. 10-2008-0005380, filed on Jan. 17, 2008, in the Korean Intellectual Property Office (KIPO), the entire contents of which are herein incorporated by reference.

BACKGROUND

1. Field

Example embodiments relate to a method of transferring carbon nanotubes, and more particularly, to a method of transferring carbon nanotubes oriented in a vertical direction to a particular location in a horizontal direction.

2. Description of the Related Art

Carbon nanotubes may be used in many fields, e.g., electron emission sources, actuators, electrodes of fuel cells, gas separation films, sensors, energy storages, and transistors. When the carbon nanotubes are used in these fields, the carbon nanotubes may be oriented in one direction. However, arranging the carbon nanotubes in a desired direction may be difficult. For example, in manufacturing a transistor in which the carbon nanotubes are used as a channel, one of the largest technical obstacles may be whether the carbon nanotubes are formed to a desired length. Other obstacles may include whether the carbon nanotubes are located in a desired position or whether the carbon nanotubes are oriented in a desired direction or not.

At least two methods of forming carbon nanotubes are available for forming carbon nanotubes utilized in a field effect transistor (FET). The first method grows the carbon nanotubes from a catalyst on a substrate. The second method coats a dispersion solution, which may be made by adding powders of the carbon nanotubes into a solvent, on a substrate.

In the direct growing method, the location and length of the carbon nanotubes may be controlled by controlling the position of the catalyst and growing time while growing the carbon nanotubes. However, controlling the growing direction of the carbon nanotubes still remains a difficult task. Recently, a report has been disclosed that the orientation direction of the carbon nanotubes growing on a quartz substrate may be affected by the crystal direction of the substrate. However, this method may hardly be applied to other substrates.

In the dispersion the dispersion method, a dispersion solution may be coated on a substrate and the carbon nanotubes generally form a network with random directionality, so controlling the direction of the carbon nanotubes may be difficult.

SUMMARY

To address the above and/or other problems, example embodiments provide a method of transferring carbon nanotubes on a substrate, onto which a device will be formed, in order to form the integrated carbon nanotubes to a desired length, in a desired position, and in a desired direction.

According to example embodiments, a method of transferring carbon nanotubes may include vertically forming carbon nanotubes on a first substrate, providing a second substrate, aligning the first substrate with the second substrate so that the carbon nanotubes.

According to example embodiments, a method of fabricating a field effect transistor, may include vertically forming carbon nanotubes on a first substrate, providing a second substrate, aligning the first substrate with the second substrate so that the carbon nanotubes.

BRIEF DESCRIPTION OF THE DRAWINGS

Example embodiments will be more clearly understood from the following detailed description taken in conjunction with the accompanying drawings. FIGS. 1A-5 represent non-limiting, example embodiments as described herein.

DETAILED DESCRIPTION OF EXAMPLE EMBODIMENTS

Example embodiments will now be described more fully with reference to the accompanying drawings, in which example embodiments are shown. Example embodiments may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any an all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Figure 1A:
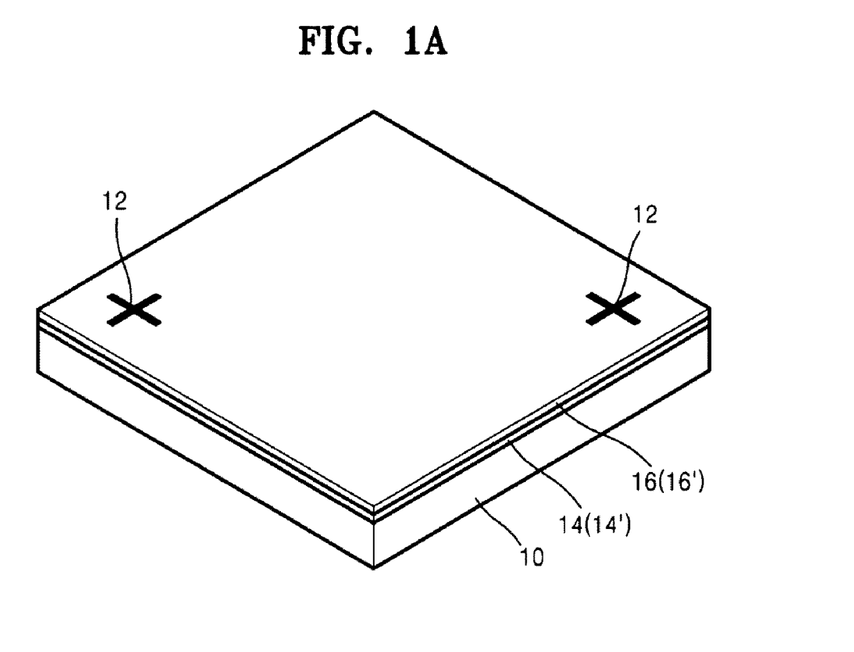
FIGS. 1A through 1F are perspective views for explaining a method of transferring integrated carbon nanotubes according to example embodiments.

FIGS. 1A through 1F are perspective views for explaining a method of transferring integrated carbon nanotubes according to example embodiments. Referring to FIG. 1A, first aligning marks 12 may be formed on a first substrate 10. The first substrate 10 may be a transparent substrate, for example, a glass substrate. In FIG. 1A, two first aligning marks 12 are shown. However, in example embodiments, more than two first aligning marks 12 may be formed.

After depositing an Al layer 14 on the first substrate 10 to a thickness of about 50 to 200 Å, the Al layer 14 may be transformed to an alumina layer 14' by annealing the Al layer 14 at a temperature of about 600° C. in the air. A catalyst layer 16 may be formed on the alumina layer 14'. The catalyst layer 16 may be formed of at least a material selected from the group consisting of Fe, Co, Ni, or an alloy of these materials. The catalyst layer 16, however, is not limited to the above mentioned materials. The catalyst layer 16 may be annealed at a temperature of about 600° C. in the air to form an oxidized catalyst layer 16'. The processes of forming the alumina layer 14' and the oxide 16' are example methods for forming carbon nanotubes vertically on the first substrate 10, and thus, the carbon nanotubes may be vertically formed on the first substrate 10 using other methods. The alumina layer 14' and the oxidized catalyst layer 16' may be formed in a transparent state on the first substrate 10.

Figure 1B:
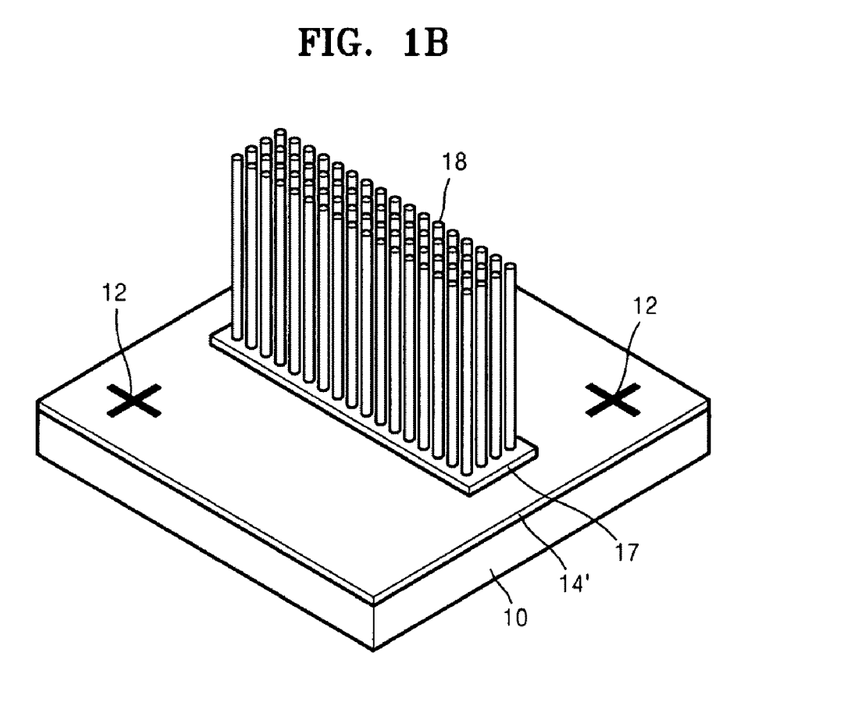

Referring to FIG. 1B, an oxidized catalyst layer pattern 17 may be formed by patterning the oxidized catalyst layer 16' on the first substrate 10. Carbon nanotubes 18 may be formed on the oxidized catalyst layer pattern 17. The carbon nanotubes 18 may be grown using methane and water as raw materials at a temperature of about 300 to 600° C., under a pressure of about 1 Torr or less, and with a plasma power of about 100 W or less using a water plasma enhanced chemical vapor deposition method. The above process may be performed at a temperature of about 450° C. with a power of about 30 W or less. The carbon nanotubes 18 may be vertically formed on the first substrate 10.

Figure 1C:
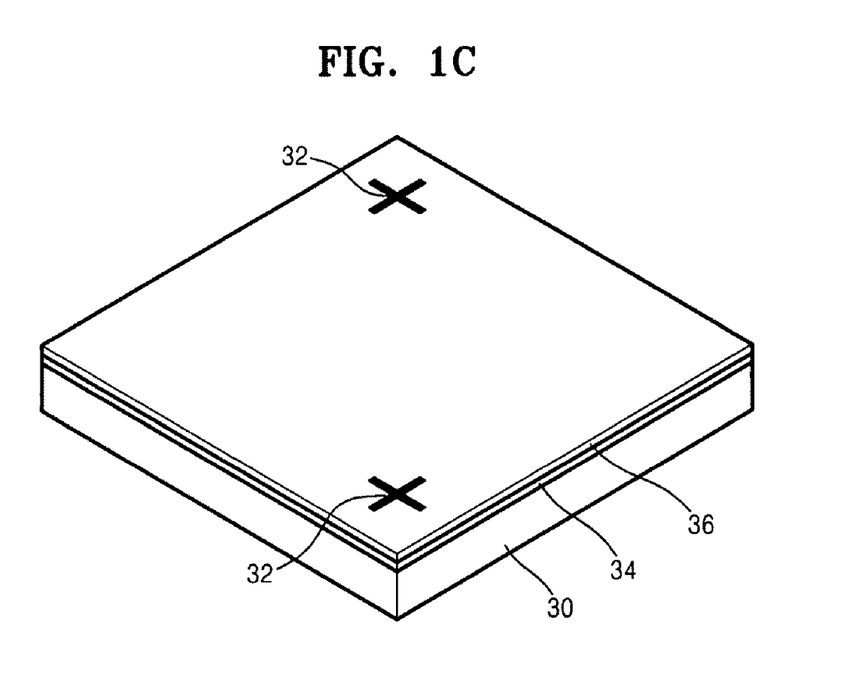

Referring to FIG. 1C, a second substrate 30 onto which the carbon nanotubes 18 are transferred may be prepared. The second substrate 30 may be a glass substrate or a semiconductor substrate. Second aligning marks 32 may be formed on the second substrate 30. A hydrophilic layer 34 may be formed on the second substrate 30. The hydrophilic layer 34 may be formed of a silicon oxide.

A barrier layer 36, which is hydrophobic, may be formed on the hydrophilic layer 34. The barrier layer 36 may be formed of a self-assembled monolayer (SAM) molecular layer formed of octadecyltrichlorosilane (OTS), an E-beam resist (ER), or a photoresist (PR). The barrier layer 36, however, is not limited to a self-assembled monolayer (SAM) molecular layer formed of octadecyltrichlorosilane (OTS), an E-beam resist (ER), or a photoresist (PR).

Figure 1D:
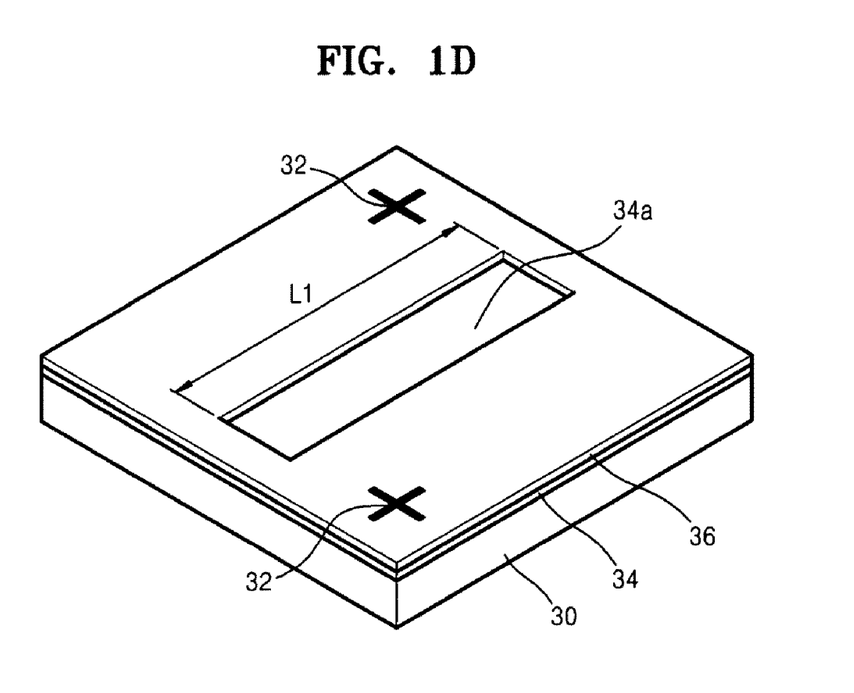

Referring to FIG. 1D, a portion of the hydrophilic layer 34 may be exposed by patterning the barrier layer 36. The length L1 of the exposed portion 34a may be formed equal to or greater than the height of the carbon nanotubes 18 formed on the first substrate 10.

Figure 1E:
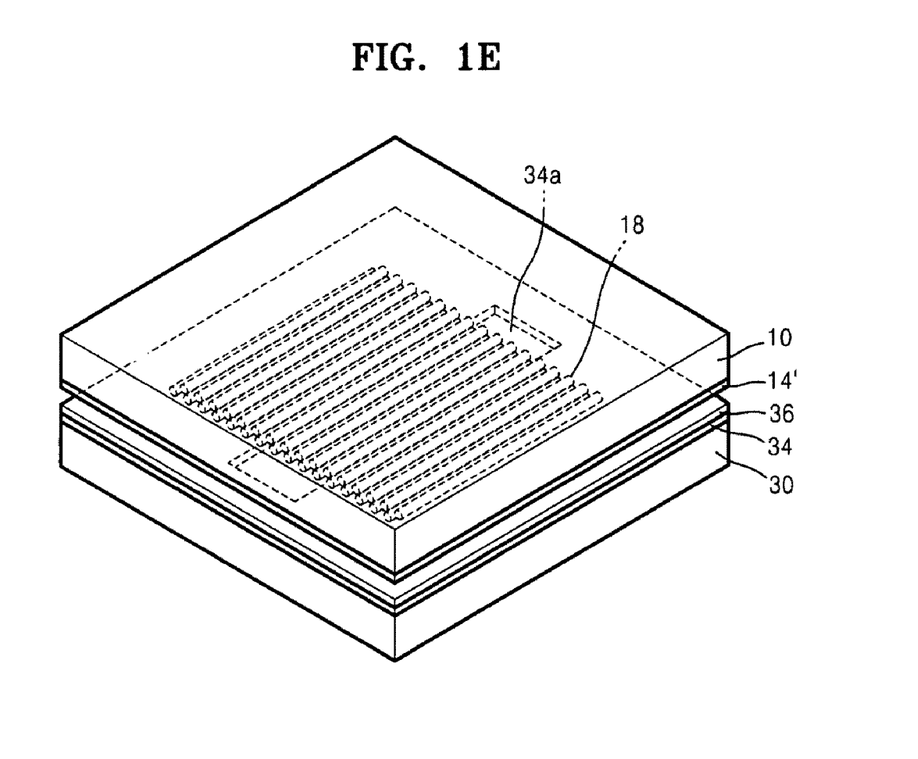

Referring to FIG. 1E, the first substrate 10 may be placed on the second substrate 30 so that a surface of the first substrate 10 on which the carbon nanotubes 18 is formed faces a surface of the second substrate 30 on which the exposed portion 34a may be formed. The first aligning marks 12 may align with the second aligning marks 32. The first substrate 10 may be pressed onto the second substrate 20 and the first substrate 10 may be pushed in a lengthwise direction of the exposed portion 34a.

Figure 1F:
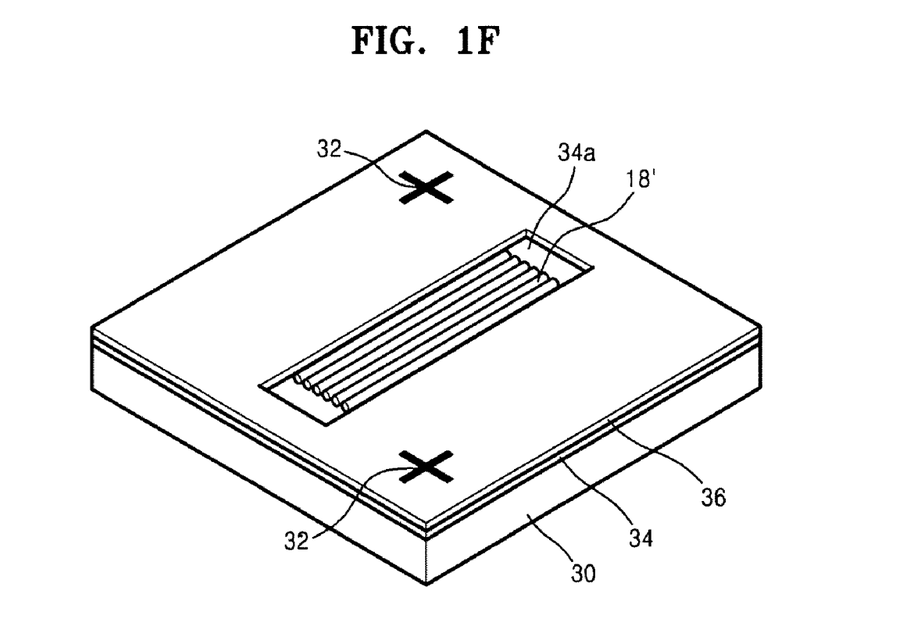

Referring to FIG. 1F, the carbon nanotubes 18, which are positioned on the exposed portion 34a of the second substrate 30, may be attached to the exposed portion 34a. The carbon nanotubes 18' transferred to the second substrate 30 may be parallelly transferred with respect to the second substrate 30. The carbon nanotubes 18, which are not attached to the exposed portion 34a, may be removed by rinsing the second substrate 30 using an organic solvent, e.g., water or methanol.

Figure 2:
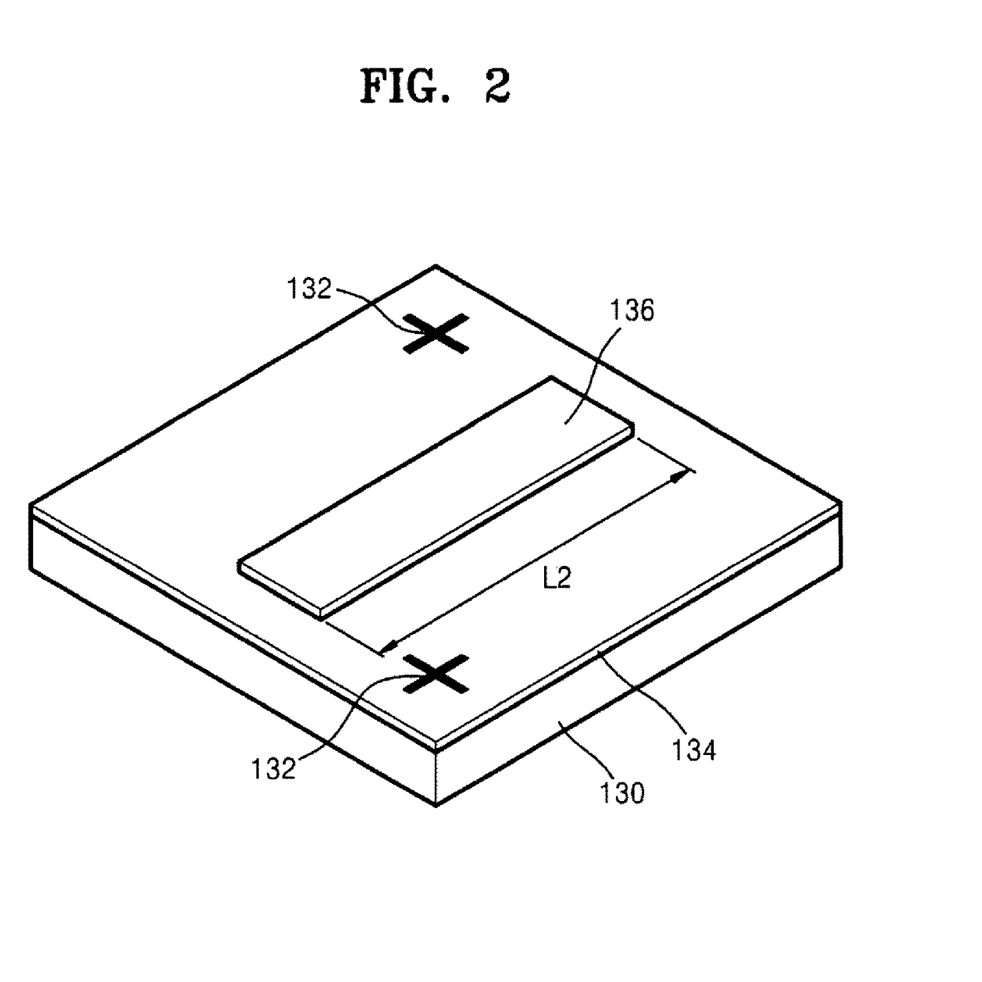
FIG. 2 is a perspective view for explaining a method of transferring carbon nanotubes according to example embodiments.

FIG. 2 is a perspective view for explaining a method of transferring carbon nanotube according example embodiments. Referring to FIG. 2, a barrier layer 134 may be formed on a second substrate 130. The barrier layer 134 may be formed of a SAM molecular layer, an E-beam resist (ER), or a photoresist (PR) but is not limited thereto. The SAM molecular layer may be formed of OTS.

A hydrophilic layer (not shown) may be formed on the barrier layer 134, and a pattern 136 to which the carbon nanotubes 18 on the first substrate 10 are transferred may be formed by patterning the hydrophilic layer. The length L2 of the pattern 136 may be greater than the height of the carbon nanotubes 18.

The hydrophilic layer may be formed of a metal, for example, Au, or an oxide, e.g., a silicon oxide or an aluminium oxide. Aligning marks 132 for aligning with the first substrate 10 in FIG. 1B may be formed on the second substrate 130. Processes of preparing the first substrate 10 and transferring the carbon nanotubes 18 formed on the first substrate 10 onto the second substrate 130 may be substantially identical to the processes described in the foregoing embodiments, and thus, the detailed descriptions thereof will not be repeated.

Figure 3A:
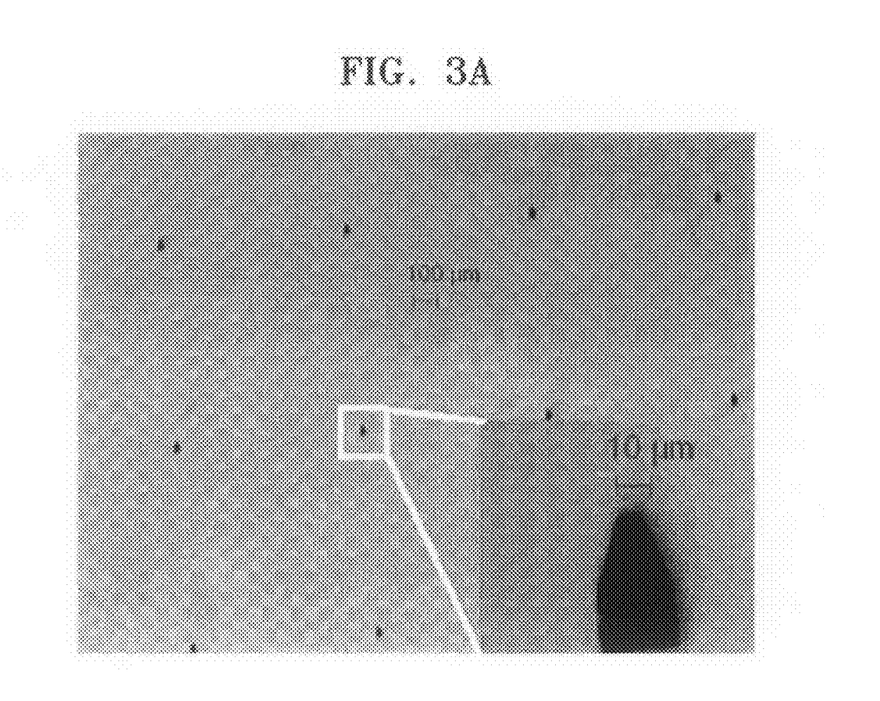
FIGS. 3A and 3B are photographs showing patterns formed of carbon nanotubes before and after transferring, respectively, according to example embodiments.
Figure 3B:
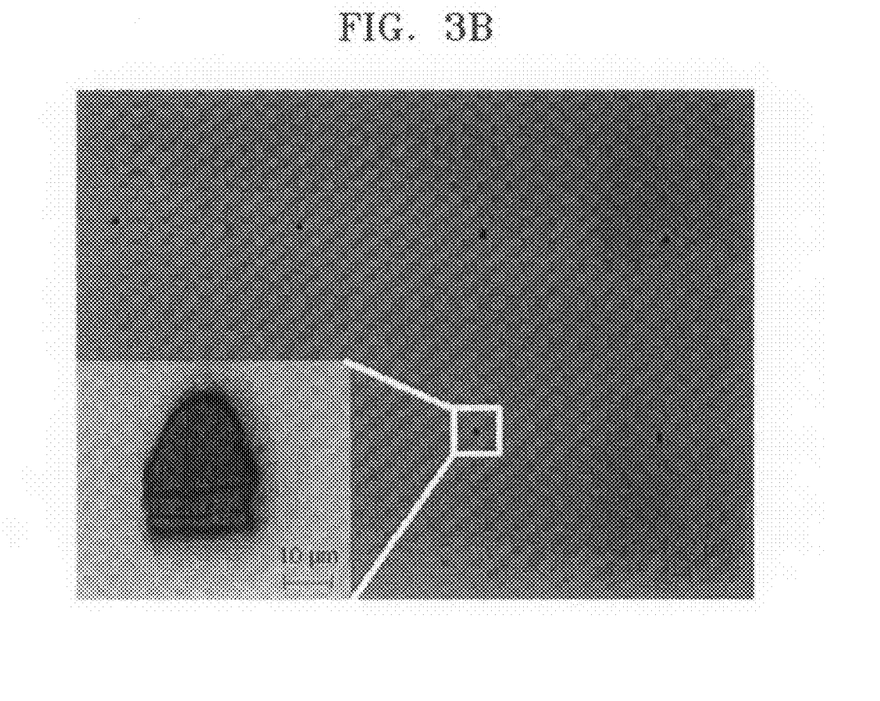

FIGS. 3A and 3B are photographs showing patterns formed of carbon nanotubes before and after transferring, respectively, according to example embodiments. Referring to FIG. 3A, carbon nanotubes vertically formed on a glass substrate (a first substrate) may have a tapered upper portion. FIG. 3B shows carbon nanotubes transferred onto a second substrate on which a silicon oxide may be deposited using a method of transferring according example embodiments. The carbon nanotubes may be transferred in a horizontal direction with respect to the second substrate, and the carbon nanotubes may be transferred in a parallel direction of pushing the first substrate.

Figure 4:
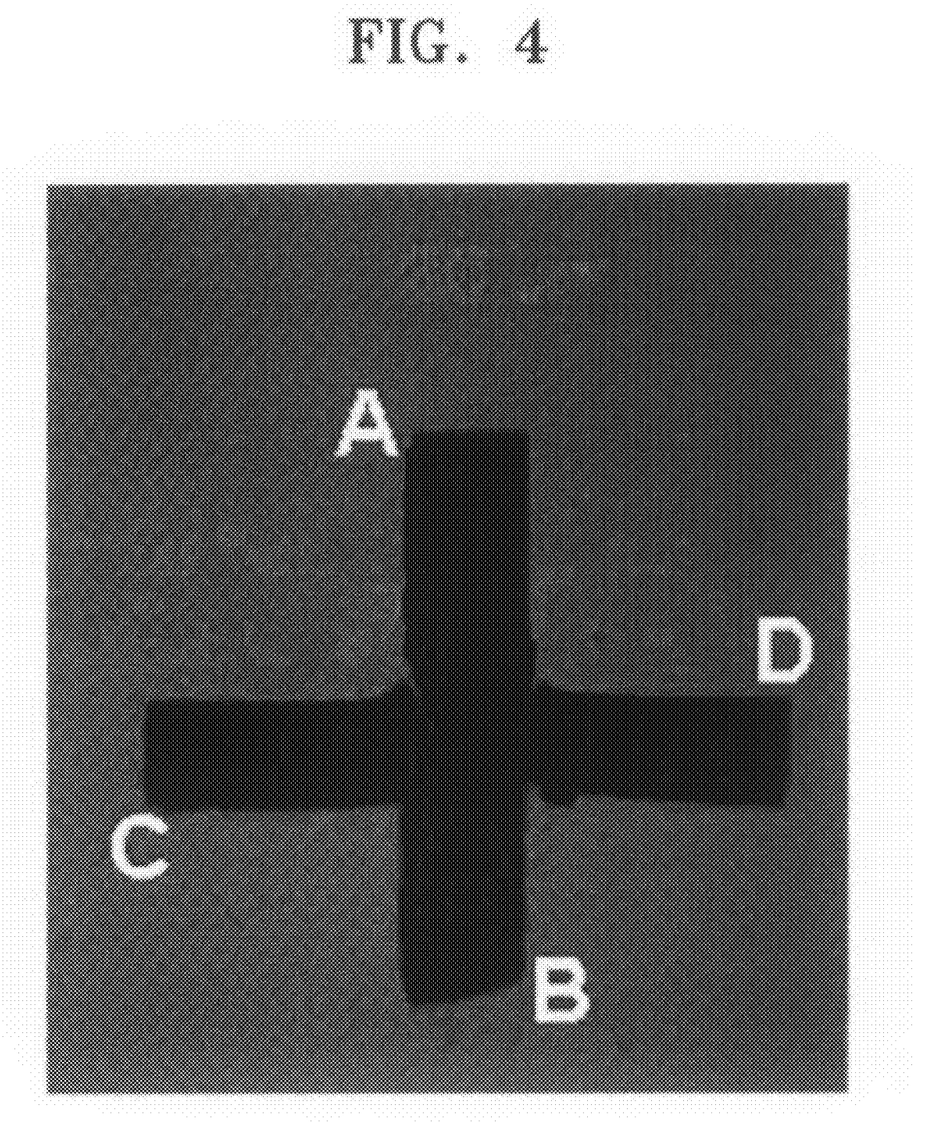
FIG. 4 is a scanning electron microscope (SEM) image of carbon nanotubes transferred to form a cross type according to example embodiments.

FIG. 4 is a SEM image of carbon nanotubes transferred in a cross pattern according to example embodiments. Referring to FIG. 4, the SEM image shows a result of transferring the carbon nanotubes of cross pattern on the first substrate onto a silicon oxide layer formed on a second substrate. The silicon oxide layer was formed to a thickness of about 400 nm. The carbon nanotubes were formed by pushing the first substrate in a direction from B to A of the cross pattern while pressing the first substrate onto the second substrate.

Figure 5A:
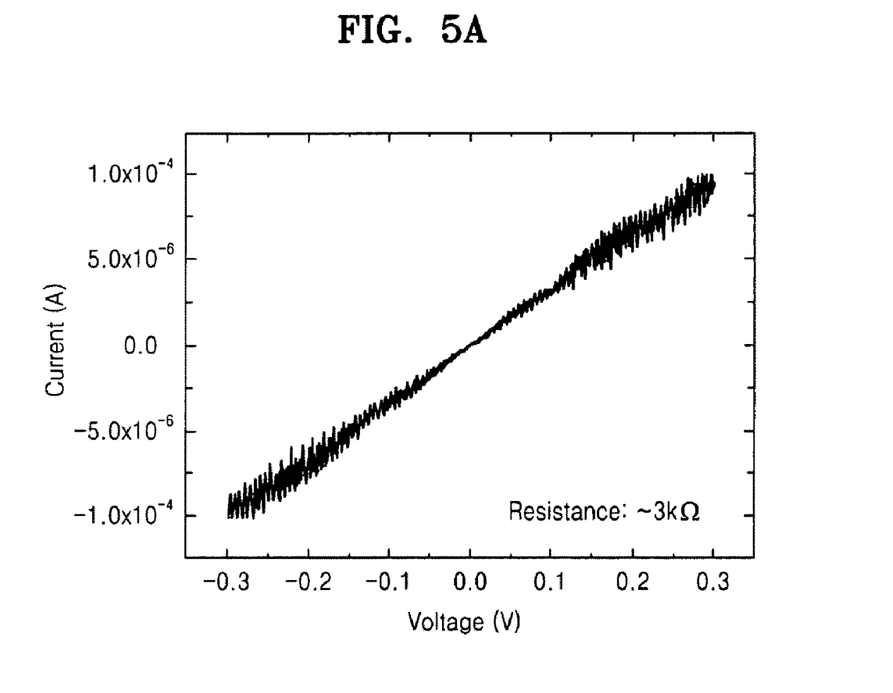
FIGS. 5A and 5B are graphs showing I-V characteristics of the cross-type pattern of FIG. 4.
Figure 5B:
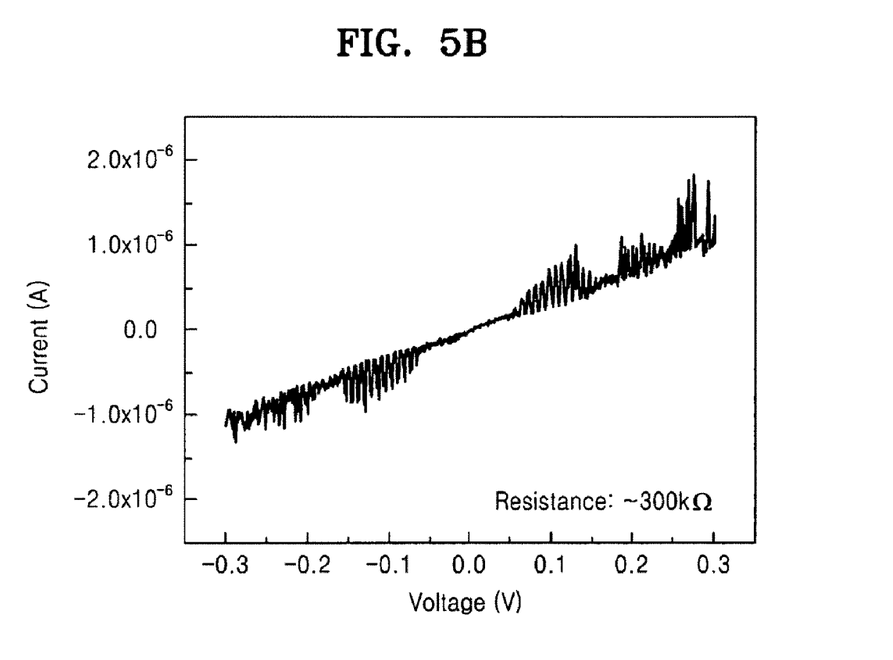

FIGS. 5A and 5B are graphs showing current-voltage characteristics of the cross pattern of FIG. 4. The graph of FIG. 5A is an I-V curve of A-B line, and the graph of FIG. 5B is an I-V curve of C-D line. The resistance measured in the A-B line was about 1/100 of that of measured in the C-D line. The lower resistance of A-B line was due to the carbon nanotubes being aligned in the A-B line direction. The result indicates that the method of transferring carbon nanotube according to example embodiments may transfer the carbon nanotubes in a specific direction horizontally. Thus, the use of the method of transferring according to example embodiments may allow the carbon nanotube to be used in various electronic devices including field effect transistors.

While example embodiments have been particularly shown and described with reference to example embodiments thereof, it will be understood by those of ordinary skill in the art that various changes in form and details may be made therein without departing from the spirit and scope of the following claims.

What is claimed is:

1. A method of transferring carbon nanotubes comprising:
    vertically forming carbon nanotubes on a first substrate;
    providing a second substrate;
    aligning the first substrate with the second substrate so that the carbon nanotubes face the second substrate; and
    transferring the carbon nanotubes onto the second substrate by pressing the first substrate onto the second substrate and pushing the first substrate in a direction perpendicular to a direction in which the first substrate is pressed onto the second substrate to arrange the carbon nanotubes in a direction parallel to a surface of the second substrate on which the nanotubes are transferred,
    wherein transferring the carbon nanotubes comprises transferring the carbon nanotubes onto the second substrate to be attached in a horizontal direction with respect to the second substrate.

2. The method of claim 1, wherein forming the carbon nanotubes comprises:
    forming a catalyst layer on the first substrate;
    patterning the catalyst layer; and
    vertically forming the carbon nanotubes with respect to the first substrate on the catalyst layer.

3. The method of claim 2, wherein forming the catalyst layer comprises:
    forming an alumina layer on the first substrate;
    forming the catalyst layer on the alumina layer, using at least one selected from the group consisting of Fe, Co, Ni, and an alloy of these metals; and
    oxidizing the catalyst layer.

4. A method of transferring carbon nanotubes comprising:
    vertically forming carbon nanotubes on a first substrate;
    providing a second substrate;
    aligning the first substrate with the second substrate so that the carbon nanotubes face the second substrate; and
    transferring the carbon nanotubes onto the second substrate by pressing the first substrate onto the second substrate, wherein
    transferring the carbon nanotubes comprises transferring the carbon nanotubes onto the second substrate to be attached in a horizontal direction with respect to the second substrate,
    forming the carbon nanotubes comprises forming a catalyst layer on the first substrate, patterning the catalyst layer, and vertically forming the carbon nanotubes with respect to the first substrate on the catalyst layer,
    forming the carbon nanotubes is performed using methane gas and water as raw materials at a temperature of about 300 to about 600° C. under a pressure of 1 Torr or less using a water plasma enhanced chemical vapor deposition method.

5. The method of claim 1, wherein providing the second substrate comprises:
    forming a hydrophilic layer on the second substrate;
    forming a hydrophobic barrier layer on the hydrophilic layer; and
    exposing a region of the hydrophilic layer onto which the carbon nanotubes are transferred by patterning the hydrophobic barrier layer.

6. The method of claim 5, wherein the hydrophilic layer is formed of a metal or an oxide.

7. The method of claim 5, wherein the hydrophilic layer is formed of one selected from Au, $SiO_2$, and $Al_2O_3$.

8. The method of claim 5, wherein the hydrophobic barrier layer is formed of at least one selected from the group consisting of a self-assembled monolayer (SAM) molecular layer, an E-beam resist (ER), and a photoresist (PR).

9. The method of claim 8, wherein the SAM molecular layer is formed of octadecyltrichlorosilane (OTS).

10. The method of claim 1, wherein providing the second substrate comprises:
    forming a hydrophobic barrier layer on the second substrate;
    forming a hydrophilic layer on the hydrophobic barrier layer; and
    removing the hydrophilic layer except for on a region of the second substrate onto which the carbon nanotubes are transferred by patterning the hydrophilic layer.

11. The method of claim 1, wherein the first substrate is a glass substrate.

12. The method of claim 1, wherein aligning the first substrate with the second substrate comprises aligning first aligning marks formed on the first substrate with second aligning marks formed on the second substrate.

13. A method of fabricating a field effect transistor, comprising:
    transferring carbon nanotubes according to the method of claim 1.

14. The method of claim 1, wherein the second substrate includes a first layer on a second layer and the first layer is patterned to expose a portion of the second layer and the pushing of the first substrate aligns the nanotubes horizontally on the exposed portion of the second layer.

15. The method of claim 14, wherein the first layer is a barrier layer and the second layer is a hydrophilic layer.

16. The method of claim 14, wherein a length of the exposed portion of the second layer is equal to or greater than a height of the nanotubes.

* * * * *